United States Patent
Hidaka et al.

(10) Patent No.: US 11,402,250 B2
(45) Date of Patent: Aug. 2, 2022

(54) LIQUID LEVEL METER, VAPORIZER EQUIPPED WITH THE SAME, AND LIQUID LEVEL DETECTION METHOD

(71) Applicant: FUJIKIN INCORPORATED, Osaka (JP)

(72) Inventors: Atsushi Hidaka, Osaka (JP); Takatoshi Nakatani, Osaka (JP); Satoru Yamashita, Osaka (JP); Katsuyuki Sugita, Osaka (JP); Kaoru Hirata, Osaka (JP); Masaaki Nagase, Osaka (JP); Kouji Nishino, Osaka (JP); Nobukazu Ikeda, Osaka (JP)

(73) Assignee: FUJIKIN INCORPORATED, Osaka (JP)

( * ) Notice: Subject to any disclaimer, the term of this patent is extended or adjusted under 35 U.S.C. 154(b) by 602 days.

(21) Appl. No.: 16/471,768

(22) PCT Filed: Dec. 22, 2017

(86) PCT No.: PCT/JP2017/046102
§ 371 (c)(1),
(2) Date: Jun. 20, 2019

(87) PCT Pub. No.: WO2018/123854
PCT Pub. Date: Jul. 5, 2018

(65) Prior Publication Data
US 2020/0088561 A1 Mar. 19, 2020

(30) Foreign Application Priority Data
Dec. 27, 2016 (JP) .............................. JP2016-252852

(51) Int. Cl.
*G01F 23/22* (2006.01)
*B01J 4/02* (2006.01)
(Continued)

(52) U.S. Cl.
CPC ................ *G01F 23/22* (2013.01); *B01J 4/02* (2013.01); *C23C 16/448* (2013.01); *G05D 9/12* (2013.01);
(Continued)

(58) Field of Classification Search
CPC ..... G01F 23/247; G01F 23/246; G01F 23/242
(Continued)

(56) References Cited

U.S. PATENT DOCUMENTS 2,766,406 A * 10/1956 Schwarzkopf ........... G05D 9/12
340/622
3,111,031 A * 11/1963 Kuritza ................. G01F 23/247
374/114
(Continued)

FOREIGN PATENT DOCUMENTS

JP S61-2022 A 1/1986
JP 59148826 A * 8/1994
(Continued)

OTHER PUBLICATIONS

International Search Report issued in PCT/JP2017/046102; dated Jan. 23, 2018.

*Primary Examiner* — David A. Rogers
(74) *Attorney, Agent, or Firm* — Studebaker & Brackett PC

(57) ABSTRACT

The liquid level meter according to the present invention includes a resistive temperature detector, a temperature measuring body located above it, a temperature detecting unit detecting temperatures of the resistive temperature detector and the temperature measuring body, a current controlling unit determining a current value to be flowed through the resistive temperature detector so that the resistive temperature detector and the temperature measuring body become a predetermined temperature difference, a
(Continued)

power supply unit supplying the current of the determined current value to the resistive temperature detector, and a liquid level detecting unit detecting a position of a liquid level. The liquid level detecting unit detects the change in the relative position of the liquid level relative to the resistive temperature detector by determining whether a change width of the current value flowing through the resistive temperature detector during a predetermined period of time is positive or negative, and whether the change width is not less than a predetermined value. As a result, the position of the liquid level can be accurately detected without being affected by the variation in the characteristics of the resistive temperature detector.

12 Claims, 8 Drawing Sheets

(51) Int. Cl.
*C23C 16/448* (2006.01)
*G05D 9/12* (2006.01)
*H01L 21/67* (2006.01)

(52) U.S. Cl.
CPC ............ *H01L 21/67248* (2013.01); *B01J 2219/00164* (2013.01)

(58) Field of Classification Search
USPC ............ 73/295, 304 R, 204.25, 290 R
See application file for complete search history.

(56) References Cited

U.S. PATENT DOCUMENTS

| | | | | |
|---|---|---|---|---|
| 3,132,515 A * | 5/1964 | Urban | G01F 23/243 | 73/295 |
| 3,181,557 A * | 5/1965 | Lannan, Jr. | G01F 23/247 | 137/391 |
| 3,281,815 A * | 10/1966 | Oster | G01F 23/247 | 340/622 |
| 3,363,466 A * | 1/1968 | Guidi | H01C 7/04 | 374/185 |
| 3,437,107 A * | 4/1969 | Waseleski, Jr. | G05D 9/12 | 137/392 |
| 3,500,687 A * | 3/1970 | Smith | G01F 23/247 | 73/295 |
| 3,882,967 A * | 5/1975 | Gulla | G01K 3/005 | 184/103.1 |
| 3,955,416 A * | 5/1976 | Waiwood | G01F 23/247 | 340/622 |
| 4,135,186 A * | 1/1979 | Minorikawa | G01F 23/247 | 340/622 |
| 4,187,723 A * | 2/1980 | Golden | G01F 23/241 | 73/295 |
| 4,590,797 A * | 5/1986 | Beaubatie | G01F 23/246 | 340/622 |
| 4,630,477 A * | 12/1986 | Murtland, Jr. | G01F 23/246 | 338/28 |
| 4,720,997 A * | 1/1988 | Doak | G01F 23/246 | 327/512 |
| 4,967,593 A * | 11/1990 | McQueen | G01F 23/248 | 210/744 |
| 5,044,764 A * | 9/1991 | Aoki | G01N 27/18 | 374/54 |
| 5,221,916 A * | 6/1993 | McQueen | G01F 23/246 | 29/613 |
| 5,339,689 A * | 8/1994 | Hegge | F17C 13/021 | 340/622 |
| 5,600,528 A * | 2/1997 | McQueen | G01F 23/246 | 361/103 |
| 5,881,207 A * | 3/1999 | DeBourg | F22B 37/78 | 392/401 |
| 6,990,861 B2 * | 1/2006 | Ham | G01F 23/248 | 73/295 |
| 7,181,965 B2 * | 2/2007 | Kearney | G01F 23/247 | 374/54 |
| 8,562,091 B2 * | 10/2013 | Sabanovic | G01F 23/246 | 347/88 |
| 10,180,139 B2 * | 1/2019 | Brostrom | F04B 39/023 | |
| 10,274,356 B2 * | 4/2019 | Hirata | G01F 23/243 | |
| 10,604,840 B2 * | 3/2020 | Hidaka | H01L 21/67248 | |
| 10,760,937 B2 * | 9/2020 | Bender | G01F 23/243 | |
| 2003/0046997 A1 * | 3/2003 | Waller | G01F 23/248 | 73/295 |
| 2006/0144140 A1 * | 7/2006 | Hache | G01F 23/22 | 73/295 |
| 2011/0100483 A1 | 5/2011 | Nagata et al. | | |
| 2016/0187174 A1 * | 6/2016 | Kharsa | F17D 5/005 | 73/204.25 |
| 2017/0268919 A1 * | 9/2017 | Hirata | G01F 23/243 | |
| 2017/0327949 A1 | 11/2017 | Hidaka et al. | | |

FOREIGN PATENT DOCUMENTS

| | | |
|---|---|---|
| JP | 3009809 B2 | 2/2000 |
| JP | 2001-99692 A | 4/2001 |
| JP | 2009-252760 A | 10/2009 |
| JP | 2010-180429 A | 8/2010 |
| JP | 2013-77710 A | 4/2013 |
| JP | 5400816 B2 | 1/2014 |
| JP | 2016-095212 A | 5/2016 |

* cited by examiner

Prior Art

LIQUID LEVEL METER, VAPORIZER EQUIPPED WITH THE SAME, AND LIQUID LEVEL DETECTION METHOD

TECHNICAL FIELD

The present invention relates to a liquid level meter for detecting a liquid level, a vaporizer capable of properly managing an accommodated liquid amount based on a liquid level detected by the liquid level meter, and a liquid level detection method. In addition, the vaporizer also includes a tank for storing a liquid and the like, and if the tank is a tank of a liquid supply system (a liquid supply device), the tank may be used at a normal temperature or at a high temperature.

BACKGROUND ART

Conventionally, a liquid-source vaporization supply apparatus (hereinafter also referred to as a vaporizer) for supplying a source fluid to a semiconductor manufacturing apparatus using, for example, Metal Organic Chemical Vapor Deposition (MOCVD)) has been proposed (for example, Patent Documents 1 to 3).

In this type of liquid raw material vaporization supply apparatus, a liquid raw material such as TEOS (Tetraethyl orthosilicate) is heated and vaporized in a vaporization chamber, and the vaporized gas is controlled to a predetermined flow rate by a flow rate control device and supplied to a semiconductor manufacturing apparatus. In order to compensate for the decrease in the raw material liquid caused by evaporation of the raw material liquid, it is necessary to detect the liquid level of the raw material liquid and control the liquid level by supplying the decreased amount.

As a method of detecting the liquid level of a raw material liquid, for example, thermal type liquid level detection apparatuses (Patent Documents 4 to 6), which utilize the fact that heat dissipation constants in a liquid phase and a gas phase are different, are known.

In this type of thermal liquid level detecting apparatus, as shown in FIG. 8, two protective pipes P respectively containing resistive temperature detectors R1 and R2 such as platinum are vertically inserted into a container C, and a relatively large constant current I1 (heating current) flows through one resistive temperature detector R1 to keep the resistive temperature detector R1 at a temperature higher than the ambient temperature by self-heating, and a micro constant current I2 (current for measuring the ambient temperature) of a magnitude that makes it possible to measure the ambient temperature and makes heat generation flows to be neglected through the other resistive temperature detector R2.

Then, the resistive temperature detector R1 through which the large current I1 flows generates heat. At this time, since the heat dissipation constant when the resistive temperature detector is in a liquid phase L is larger than the heat dissipation constant when the resistive temperature detector is in a gas phase G, the temperature of the resistive temperature detector when the resistive temperature detector is in the gas phase G is higher than that when the resistive temperature detector is in the liquid phase L.

Since this means that the resistive temperature detector in the gas phase has a higher resistance value than the resistive temperature detector in the liquid phase, it is possible to determine whether the resistive temperature detectors are positioned above or below the liquid level by observing the difference (absolute value) between the voltage output of the resistive temperature detector R1 through which a large current flows and the voltage output of the resistive temperature detector R2 through which a micro current flows. That is, it can be determined that the resistive temperature detectors are below the liquid level when the difference is small, and it can be determined that the resistive temperature detectors are above the liquid level when the difference is large.

PRIOR ART DOCUMENT

Patent Reference

Patent Document 1: Japanese Laid-Open Patent Publication No. 2009-252760
Patent Document 2: Japanese Laid-Open Patent Publication No. 2010-180429
Patent Document 3: Japanese Laid-Open Patent Publication No. 2013-77710
Patent Document 4: Japanese Patent No. 3009809
Patent Document 5: Japanese Patent No. 5400816
Patent Document 6: Japanese Laid-Open Patent Publication No. 2001-99692

SUMMARY OF INVENTION

Technical Problem

In the conventional liquid level detection described above, since the liquid phase or the gas phase is determined by comparing the almost instantaneous value of the voltage difference between the resistive temperature detectors R1 and R2 with a predetermined reference value (threshold value), there is a problem of erroneous detection due to the influence of individual differences of the resistive temperature detectors used, that is, variations in characteristic values, in addition to erroneous detection due to the influence of noise or the like. For example, a case that a resistive temperature detector R1 which outputs a higher value and a resistive temperature detector R2 which outputs a lower value are used, or a case that a resistive temperature detector R1 which outputs a lower value and a resistive temperature detector R2 which outputs a higher value are used, is conceivable. In the former case and the latter case, even when the positional relationship between the resistive temperature detectors R1 and R2 and the liquid level is the same, the voltage difference between the resistive temperature detectors R1 and R2 in the former case becomes larger than that in the latter case. Although it is possible to improve the detection accuracy by setting an appropriate reference value for each resistive temperature detector to be used, it takes time and labor to adjust and is not suitable for mass production.

In addition, since two resistive temperature detectors disposed at the same height are used, it is necessary to provide 2n resistive temperature detectors in order to detect the liquid level at two or more n (n is a positive value) levels. If n is large, there is a problem that the resistive temperature detectors occupy a large space in the container.

In order to reduce the number of resistive temperature detectors, it is also conceivable to dispose a plurality of resistive temperature detectors at different heights. One resistive temperature detector is used to measure the reference temperature (a micro current flows), and current values of the other resistive temperature detectors are changed so as to generate a constant temperature difference from the reference temperature. By comparing the instantaneous value of each current value being changed with a predetermined reference value (threshold value), the liquid level position can be detected. However, also in this case, as described above, there is a problem of erroneous detection due to the influence of the variation in the characteristic value of the resistive temperature detector.

It is a main object of the present invention to provide a liquid level meter capable of solving the above-mentioned problems and accurately detecting a liquid level, a vaporizer provided with the same, and a liquid level detecting method.

Solution to Problem

In order to achieve the above object, the liquid level meter according to a first aspect of the present invention includes a first resistive temperature detector, a temperature measuring body disposed at a position higher than a position of the first resistive temperature detector disposed, and a control unit detecting a position of a liquid level using the temperature measuring body and the first resistive temperature detector, wherein when a current value flowing through the first resistive temperature detector has changed by a predetermined constant value or more within a predetermined period of time, the control unit detects that the position of the liquid level has changed from a position higher than the position of the first resistive temperature detector disposed to a position lower than the position of the first resistive temperature detector disposed, or detects that the position of the liquid level has changed from a position lower than the position of the first resistive temperature detector disposed to a position higher than the position of the first resistive temperature detector disposed.

The control unit may include a temperature detecting unit, a liquid level detecting unit, and a current control unit, wherein the temperature detecting unit detects temperatures of the temperature measuring body and the first resistive temperature detector, the current control unit determines a current value to be flowed through the first resistive temperature detector such that a temperature difference between the temperature of the first resistive temperature detector detected by the temperature detecting unit and the temperature of the temperature measuring body detected by the temperature detecting unit becomes a predetermined first value, and the liquid level detecting unit may detect the position of the liquid level from a change in the current value flowing through the first resistive temperature detector.

The liquid level meter may further include a power supply unit applying a current having the current value determined by the current control unit to the first resistive temperature detector.

The liquid level detecting unit may detect that the liquid level has changed from a position higher than the position of the first resistive temperature detector disposed to a position lower than the position of the first resistive temperature detector disposed if the change width of the current value flowing through the first resistive temperature detector within the predetermined period of time is a negative value and an absolute value of the change width is equal to or greater than a positive predetermined second value, and may detect that the liquid level has changed from a position lower than the position of the first resistive temperature detector disposed to a position higher than the position of the first resistive temperature detector disposed, if the change width is a positive value and the absolute value of the change width is equal to or greater than the second value.

The first resistive temperature detector and the temperature measuring body may be fixed in a horizontal direction by a support member.

The temperature measuring body may be a resistive temperature detector through which a current having a value smaller than the value of the current flowing through the first resistive temperature detector flows.

When the current value applied to the first resistive temperature detector so that the temperature difference becomes the first value is larger than a predetermined upper limit value, the current control unit may maintain the current value applied to the first resistive temperature detector at the upper limit value, and when the current value applied to the first resistive temperature detector so that the temperature difference becomes the first value is smaller than a predetermined lower limit value, the current control unit may maintain the current value applied to the first resistive temperature detector at the lower limit value.

The liquid level meter may further include a voltage measuring unit measuring a voltage of both ends of the first resistive temperature detector, wherein the temperature detecting unit may determine the temperature of the first resistive temperature detector from the voltage of both ends of the first resistive temperature detector measured by the voltage measuring unit, and the current controlling unit may determine the current value to be flowed to the first resistive temperature detector as a value smaller than the current value flowing through the first resistive temperature detector when the temperature difference is larger than a predetermined reference value, determine the current value to be flowed to the first resistive temperature detector as a value larger than the current value flowing through the first resistive temperature detector when the temperature difference is smaller than the reference value, and determine the current value to be flowed to the first resistive temperature detector as a same value as the current value flowing through the first resistive temperature detector when the temperature difference is equal to the reference value.

The liquid level detecting unit may output a signal to raise the liquid level when it is determined that the liquid level is at a position lower than the position where the first resistive temperature detector is disposed, and the liquid level detecting unit may output a signal to stop the rise of the liquid level when it is determined that the liquid level is at a position higher than the position where the first resistive temperature detector is disposed.

The liquid level meter further includes a second resistive temperature detector to which a current of an arbitrary magnitude is applied, wherein the second resistive temperature detector is disposed at a position lower than the position where the temperature measuring body is disposed and at a height different from the position where the first resistive temperature detector is disposed, the temperature detecting unit detects a temperature of the second resistive temperature detector, the current controlling unit determines a current value to be flowed to the second resistive temperature detector so that a temperature difference between the temperature of the second resistive temperature detector detected by the temperature detecting unit and the temperature of the temperature measuring body detected by the temperature detecting unit becomes the first value, the power supply unit flows a current of the current value to be flowed to the second resistive temperature detector determined by the current controlling unit to the second resistive temperature detector, the liquid level detecting unit detects that the liquid level is changed from a position higher than the position where the second resistive temperature detector is disposed to a position lower than the position where the second resistive temperature detector is disposed if a change width of the current value flowed through the second resistive temperature detector is a negative value and an absolute value of the change width is equal to or greater than a positive predetermined second value, and that the liquid level is changed from a position lower than the position where the second resistive temperature detector is disposed to a position higher than the position where the second resistive temperature detector is disposed if the change width of the current value flowed through the second resistive temperature detector is a positive value and the absolute value of the change width is equal to or greater than the second value, and the liquid level detecting unit detects the position of the liquid level from the detection result of the position of the liquid level using the first resistive temperature detector and the detection result of the position of the liquid level using the second resistive temperature detector.

The second resistive temperature detector may be disposed between the first resistive temperature detector and the temperature measuring body in the vertical direction, and the liquid level detecting unit may output a signal to raise the liquid level when it is determined that the liquid level is at a position lower than the position where the first resistive temperature detector is disposed, and the liquid level detecting unit may output a signal to stop the rise of the liquid level when it is determined that the liquid level is at a position higher than the position where the second resistive temperature detector is disposed.

The first resistive temperature detector, the second resistive temperature detector, and the temperature measuring body may be platinum resistive temperature detectors.

The vaporizer according to a second aspect of the present invention includes a container provided with any one of the above-mentioned liquid level meters, a liquid level of a liquid contained in the container is detected by the liquid level meter, and the liquid to be vaporized is contained in the container.

A liquid level detecting method according to a third aspect of the present invention is a method of detecting a liquid level using a resistive temperature detector and a temperature measuring body disposed at a position higher than a position where the resistive temperature detector is disposed, including a step of detecting temperatures of the resistive temperature detector and the temperature measuring body with current flowing to the resistive temperature detector, a step of adjusting a current value flowing through the resistive temperature detector so that a temperature difference between a detected temperature of the resistive temperature detector and a detected temperature of the temperature measuring body becomes a predetermined first value, and a detecting step of detecting a position of the liquid level from a change width of the current value flowing through the resistive temperature detector within a predetermined constant time, wherein the detecting step includes a step of detecting that the liquid level has changed from a position higher than a position of the resistive temperature detector disposed to a position lower than the position of the resistive temperature detector disposed if the change width is a negative value and an absolute value of the change width is equal to or more than a positive second value, and a step of detecting that the liquid level has changed from a position lower than the position of the resistive temperature detector disposed to a position higher than the position of the resistive temperature detector disposed if the change width is a positive value and the absolute value of the change width is equal to or greater than the second value.

Advantageous Effects of Invention

According to the liquid level meter, the vaporizer provided with the liquid level meter, and the liquid level detecting method of the present invention, the liquid level position can be detected with high accuracy without being affected by the variation in the characteristic value of the resistive temperature detector used.

By providing an upper limit to the value of the current flowing through the resistive temperature detector, it is possible to suppress erroneous detection due to the fluctuation width exceeding the reference value even though it is in the liquid phase. Further, by providing a lower limit to the value of the current flowing through the resistive temperature detector, it is possible to suppress erroneous detection due to the fluctuation width exceeding the reference value even though it is in the gas phase.

DESCRIPTION OF EMBODIMENTS

Figure 1:
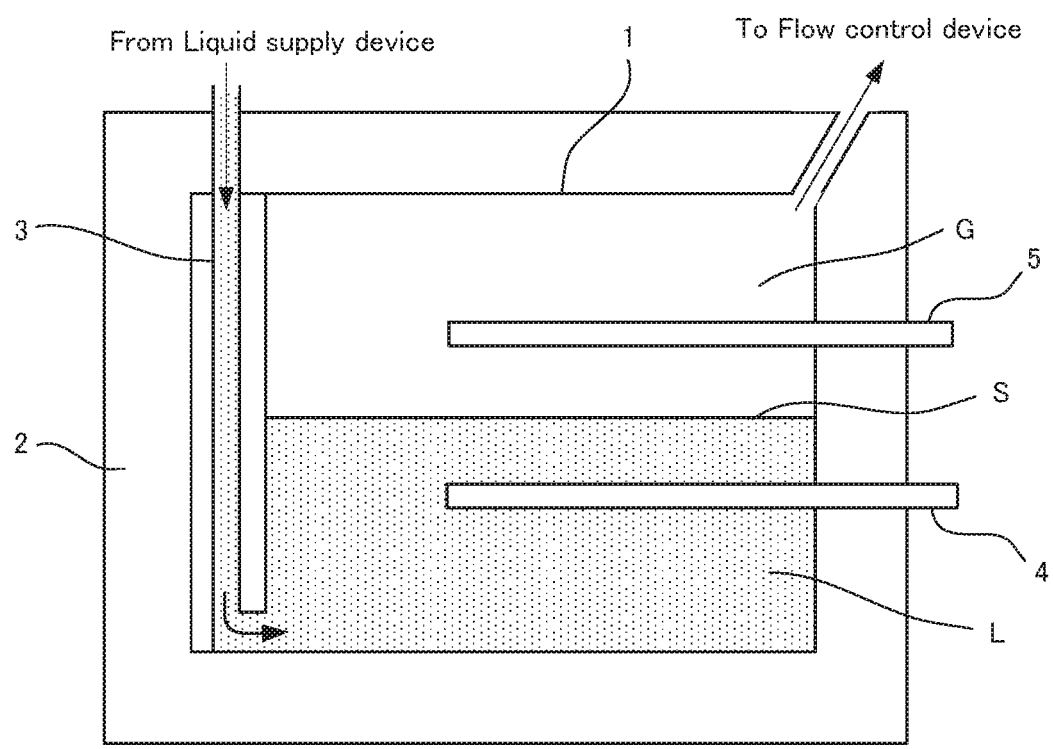
FIG. 1 is a partial cross-sectional side view showing a vaporizer provided with a liquid level meter according to an embodiment of the present invention.

Embodiments of a liquid level meter, a vaporizer, and a liquid level detection method according to the present invention will be described below with reference to the drawings. The same or similar components are denoted by the same reference numerals throughout the drawings and the embodiments.

FIG. 1 shows a schematic structure of a vaporizer provided with a liquid level meter according to an embodiment of the present invention. The vaporizer includes a container 1 for accommodating a liquid, a support portion 2 for supporting the container 1, a liquid supply pipe 3 for supplying the liquid L to the container 1 from a liquid supply device (not shown), a first protection pipe 4 and a second protection pipe 5 disposed at different heights on the wall of the container 1, and a heater (not shown) for vaporizing the liquid L in the container 1. The vaporized gas is supplied to a flow control device (not shown). Resistive temperature detectors, which will be described later, are respectively sealed in the first protection pipe 4 and the second protection pipe 5 and are used for measuring a temperature. In FIG. 1, a liquid level S of the liquid L is located between the first protection pipe 4 and the second protection pipe 5. The liquid level S drops with the evaporation of the liquid L, and rises with the supply of the liquid L by the liquid supply device. A space above the liquid level S is a gas phase G containing the vaporized gas.

Figure 2:
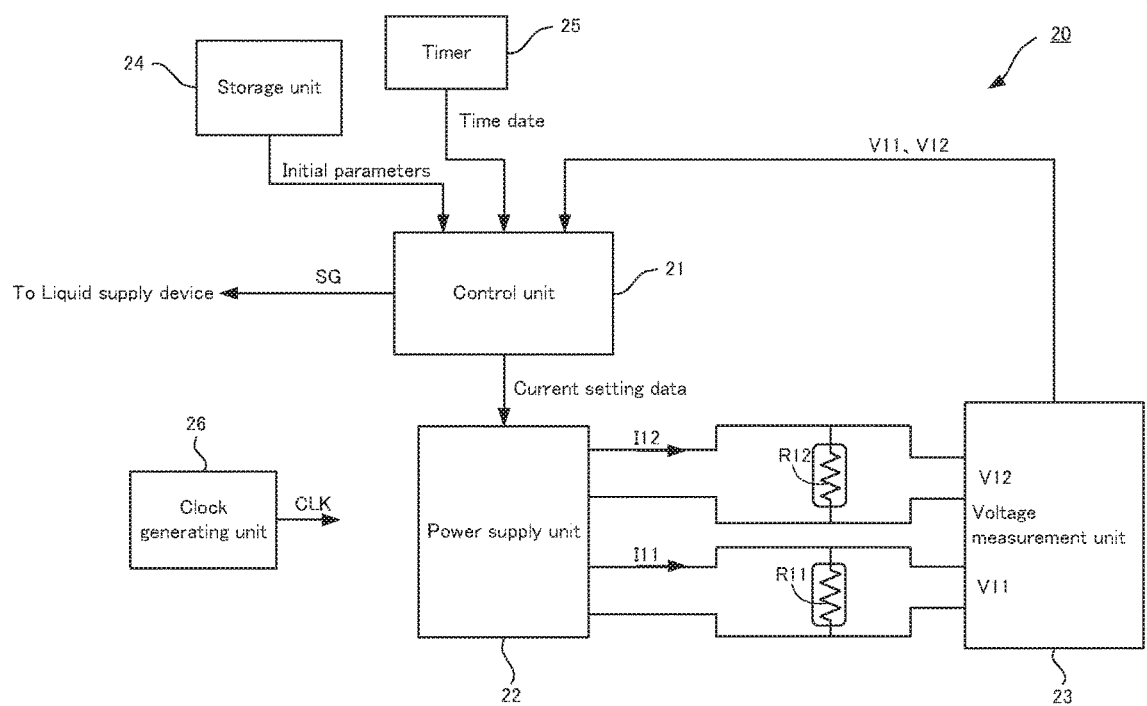
FIG. 2 is a block diagram showing a liquid level meter according to an embodiment of the present invention.

FIG. 2 shows a schematic configuration of a liquid level meter according to an embodiment of the present invention. The liquid level meter 20 according to the present embodiment includes a first resistive temperature detector R11 and a second resistive temperature detector R12, a control unit 21, a power supply unit 22, a voltage measuring unit 23, a storage unit 24, a timer 25, and a clock generating unit 26. Although not shown in FIG. 2, the liquid level meter 20 also includes components necessary for functioning as a liquid level meter, such as a power supply for supplying power necessary for each unit.

Each of the first resistive temperature detector R11 and the second resistive temperature detector R12 uses a platinum resistive temperature detector corresponding to a Pt100 specified by the Japanese Industrial Standard (JIS) or the IEC-standard, and has a nominal resistance (at 0° C.) of 100Ω. The platinum resistive temperature detector is suitable for the resistive temperature detector because the relationship between the resistance value and the temperature changes linearly, the change rate is large, and the reproducibility is excellent. The platinum resistive temperature detector may be generally composed of a platinum resistive element, internal conductors, insulators, a protective pipe, terminals, and the like.

Figure 3:
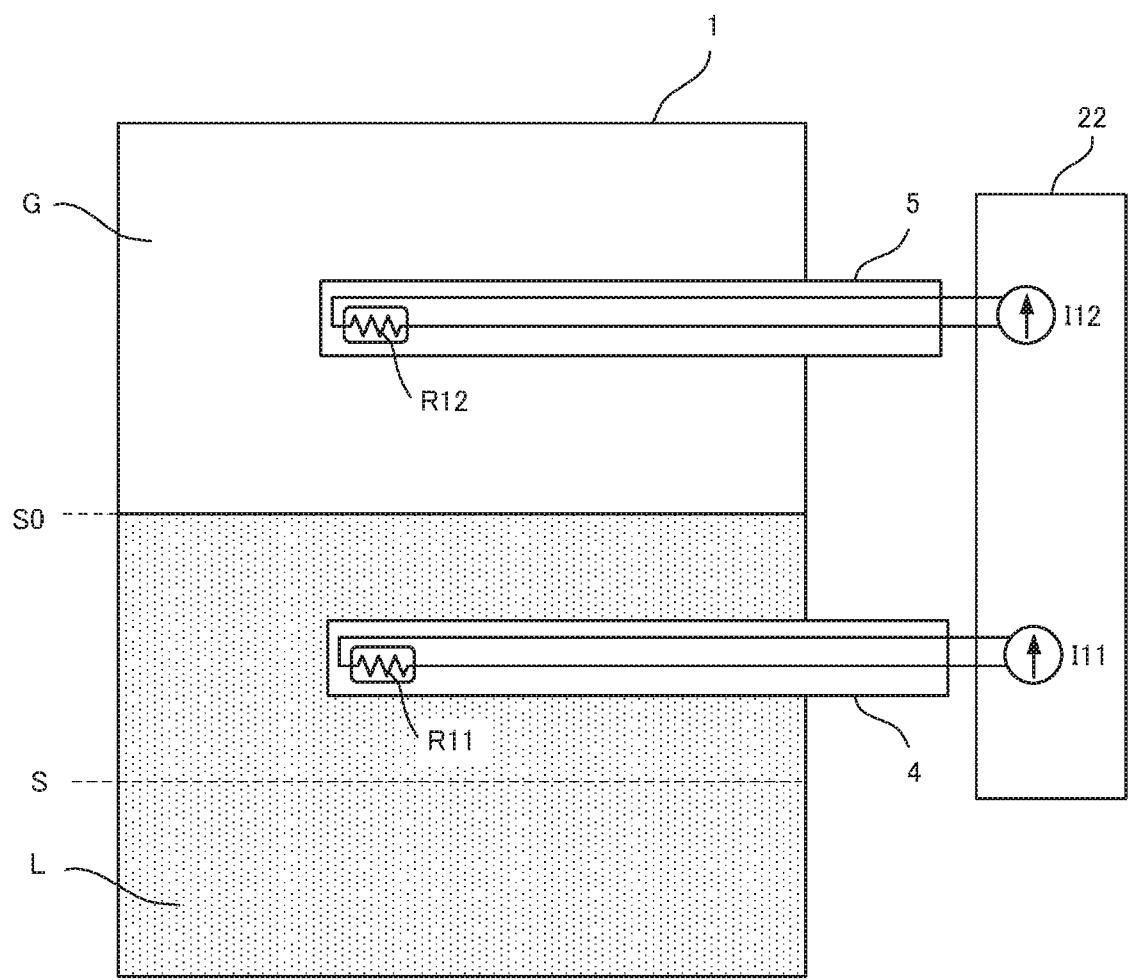
FIG. 3 is a schematic diagram showing the arrangement of a first and a second resistive temperature detector in the liquid level meter according to an embodiment of the present invention.

Referring to FIG. 3, the first resistive temperature detector R11 and the second resistive temperature detector R12 are sealed in the first protection pipe 4 and the second protection pipe 5, respectively, and are disposed in the container 1 containing the liquid phase (liquid) L. The second resistive temperature detector R12 is positioned at a position higher than a position where the first resistive temperature detector R11 is positioned, so as to be always positioned in the gas phase (gas) G. In FIG. 3, the initial liquid level S0 is located between the first resistive temperature detector R11 and the second resistive temperature detector R12. The gas which was produced from the liquid L vaporized is discharged from the container 1 and supplied to an external device (flow rate control device or the like), whereby the liquid level of the liquid L drops from the initial liquid level S0 (the dropped liquid level position is denoted by S).

The control unit 21 controls the entire liquid level meter 20. The control unit 21 is comprised of, for example, a well-known semiconductor arithmetic element (CPU) and a semiconductor memory element (RAM or the like). A predetermined program executed by the control unit 21 is stored in the storage unit 24. When the power of the liquid level meter 20 is turned on, the control unit 21 reads out the predetermined program from the storage unit 24 and executes the program. As described below, the control unit 21 detects a change in the liquid level by the first resistive temperature detector R11 and the second resistive temperature detector R12, and outputs a liquid supply signal SG to the liquid supply device in accordance with the position of the liquid level so that the liquid supply device, which is an external device, can supply or stop the supply of the liquid into the container 1.

The power supply unit 22 receives the current setting data from the control unit 21, and flows the currents I11 and I12 corresponding to the input current setting data to the first resistive temperature detector R11 and the second resistive temperature detector R12, respectively. The power supply unit 22 includes a D/A converter, and generates analog currents I11 and I12 corresponding to the digital current setting data received from the control unit 21. The power supply unit 22 can be configured using two sets of known D/A converters and amplifiers.

The voltage measuring unit 23 measures the voltages V11 and V12 at both ends of the first resistive temperature detector R11 and the second resistive temperature detector R12, respectively, and outputs the measured values V11 and V12 to the control unit 21. The voltage measuring unit 23 includes an A/D converter, and the measured values V11 and V12 are digital data generated from analog voltages. The voltage measuring unit 23 may be configured using a known digital voltmeter IC or using two sets of known amplifiers and A/D converters.

The storage unit 24 also stores initial values of parameters necessary for the control unit 21 to control the entire liquid level meter 20. The control unit 21 reads out the initial parameters from the storage unit 24 immediately after executing the program.

The timer 25 generates time data from an input clock, and outputs the time data to the control unit 21. The clock generating unit 26 generates a clock necessary for the operation of each unit and supplies the clock to each unit.

The operation principle of the liquid level meter 20 will be described below. The temperature of the first resistive temperature detector R11 and the second resistive temperature detector R12 rises, when energized. Based on the temperature linearity of the resistance values of the platinum resistive temperature detector, temperatures T1 and T2 of the first resistive temperature detector R11 and the second resistive temperature detector R12 may be calculated from the voltages V11 and V12 at both ends of the first resistive temperature detector R11 and the second resistive temperature detector R12, respectively. Specifically, the temperature Tj (° C.) of R1j (j=1 or 2) can be calculated by using the resistance value R1j(0) at 0° C. and the present current value I1j as below.

$$Tj=\{(V1j/I1j)-R1j(0)\}/(\alpha \times R1j(0))$$ (Equation 1)

Here, α is a temperature coefficient (1/° C.) in the case where the resistance value is a linear function of the temperature.

In the case of a platinum resistive temperature detector Pt100, α=0.003851. Since the resistance value R1j(0) of the Pt100 at 0° C. is 100Ω, describing V1j/I1j=Rj, the above Equation 1 can also be described as below.

$$Tj=(Rj-100)/0.3851$$ (Equation 2)

Among the first resistive temperature detector R11 and the second resistive temperature detector R12, a micro constant current (e.g., 2 mA) is flowed to the second resistive temperature detector R12. On the other hand, a current (heating current) larger than that of the second resistive temperature detector R12 is flowed to the first resistive temperature detector R11, the first resistive temperature detector R11 is maintained at a temperature higher than the ambient temperature by self-heating, and the current value to be flowed to the first resistive temperature detector R11 is adjusted (feedback control) so that the T1−T2 (T1>T2) becomes a predetermined value (for example, T1−T2=10(° C.)). While the second resistive temperature detector R12 is disposed in the gas phase, the first resistive temperature detector R11 is affected by a change in the ambient environment (thermal conductivity) due to the rise and drop of the liquid level. That is, in a state in which a constant current flows, T1 is small when the first resistive temperature detector R11 is in the liquid phase L (the heat radiation effect is high), and is large when the first resistive temperature detector R11 is in the gas phase G (the heat radiation effect is low). In order to set the T1−T2 to a predetermined value, the current value needs to be adjusted to increased if the first resistive temperature detector R11 is in the liquid phase L, and the current value needs to be adjusted to decrease if the first resistive temperature detector R11 is in the gas phase G. Therefore, the liquid level S can be specified by the current value to be supplied to the first resistive temperature detector R11 in order to maintain the T1−T2 at a predetermined value.

Figure 4:
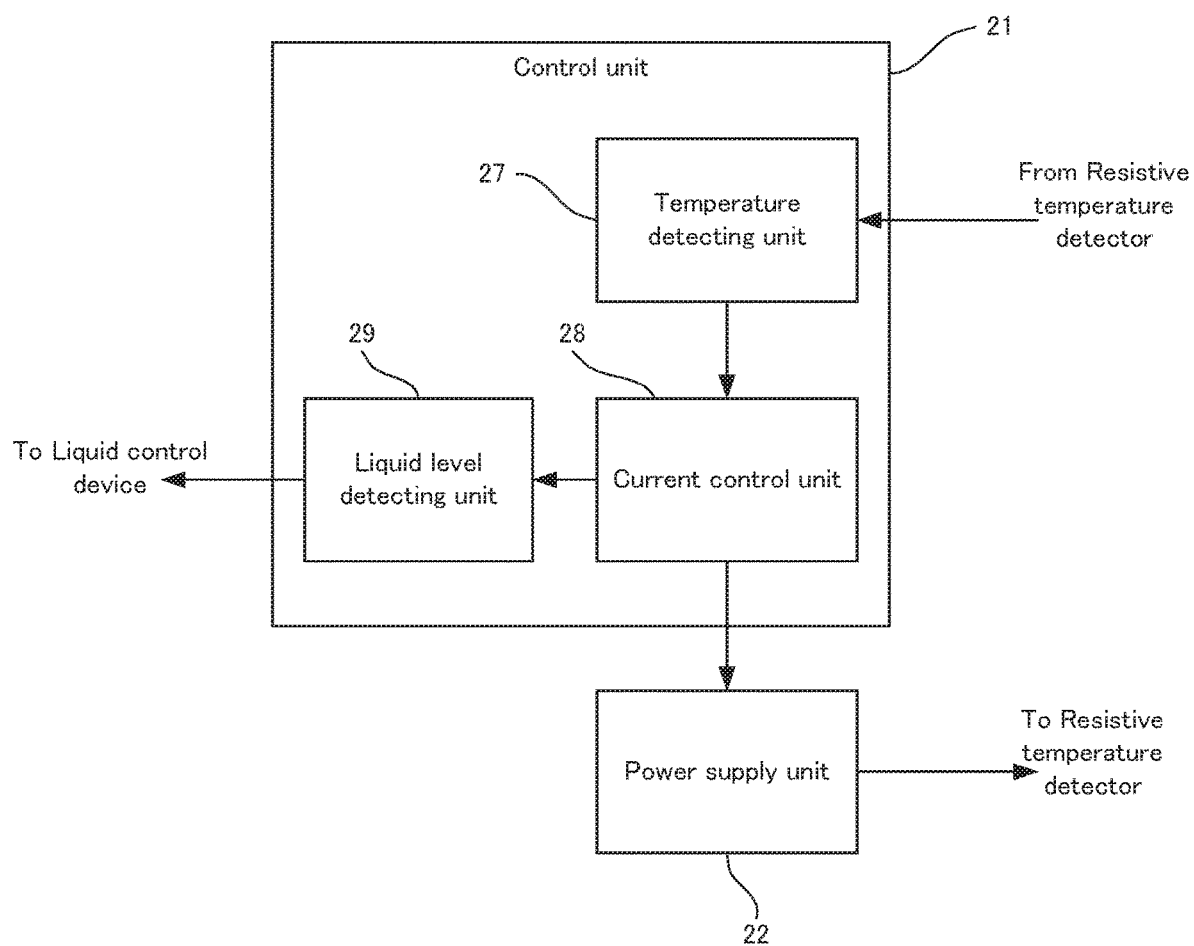
FIG. 4 is a block diagram showing a function of a control unit.

Specifically, referring to the functional block diagram of the control unit 21 shown in FIG. 4, the temperature detecting unit 27 calculates a present temperature Tj (j=1 or 2) from the voltage V1j (j=1 or 2) and the above Equation 1 or 2, and upon receiving the calculation result, the current control unit 28 changes the value of the current I11 so that the value of T1−T2=ΔT is satisfied. That is, the current control unit 28 controls the power supply unit 22 so as to decrease the current I11 when T1−T2>ΔT, increase the current I11 when T1−T2<ΔT, and maintain the present current value when T1−T2=ΔT. Then, the temperature detecting unit 27, the current control unit 28, and the power supply unit 22 repeat the above described feedback control, and the liquid level detecting unit 29 stores the variation of the current value of the first resistive temperature detector R11 for a predetermined period of time, specifies whether the first resistive temperature detector R11 is in the liquid phase or in the gas phase using the stored data, and specifies the current liquid level S. That is, the liquid level detecting unit 29 detects a liquid level at a position higher than the position where the first resistive temperature detector R11 is disposed, or a liquid level at a position lower than the position where the first resistive temperature detector R11 is disposed. The liquid level detection unit 29 controls the liquid supply device in accordance with the specified position of the liquid level.

Figure 5:
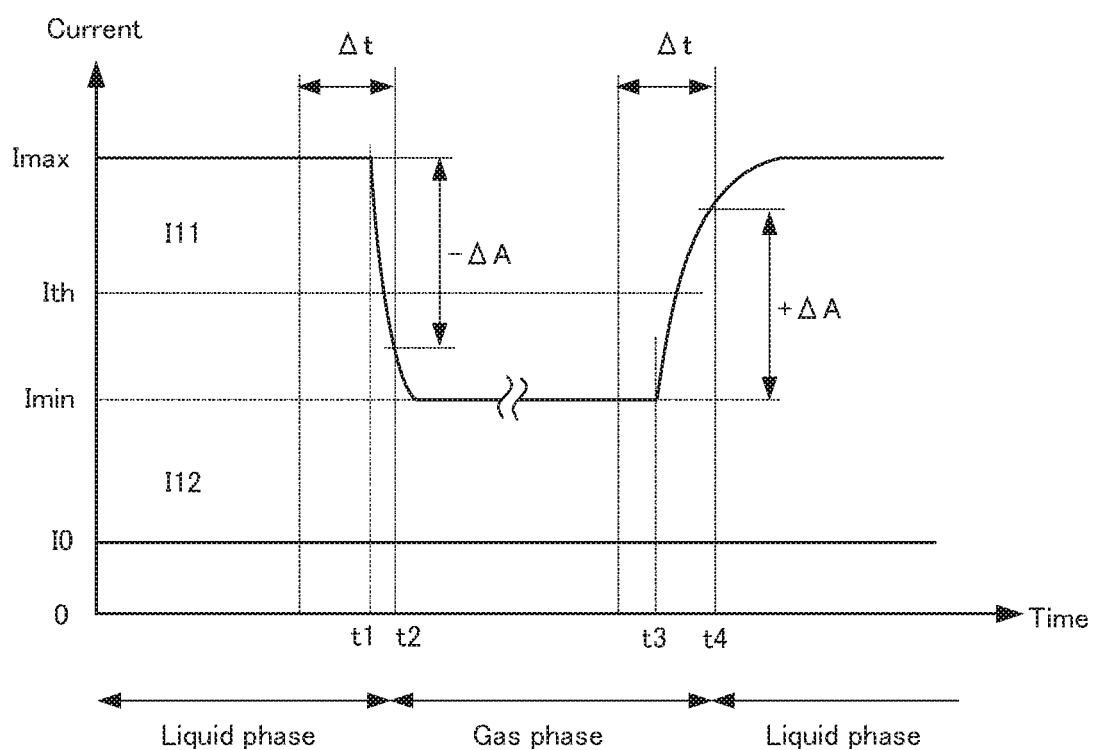
FIG. 5 is a graph schematically showing the principle of liquid phase/gas phase determination.

FIG. 5 schematically shows a change in the liquid level position of the liquid in the container 1 and a change in the current value I11 of the first resistive temperature detector R11 accompanying the change in the liquid level position. FIG. 5 shows a current change of the first resistive temperature detector R11 when the liquid level S0 is positioned between the first resistive temperature detector R11 and the second resistive temperature detector R12 as shown in FIG. 3 at first, the liquid level is dropped by evaporation of the liquid, the first resistive temperature detector R11 is positioned in the gas phase once, and then the liquid is supplied from the liquid supply device, and the first resistive temperature detector R11 is positioned in the liquid phase again. The description on the bottom of FIG. 5 represents the ambient environment of the first resistive temperature detector R11. The current value I12 of the second resistive temperature detector R12 disposed in the gas phase is maintained at a constant micro current I0 (e.g., 2 mA) regardless of the elapse of time.

Initially, the first resistive temperature detector R11 is in the liquid phase, and the value of the current I11 of the first resistive temperature detector R11 is large in order to maintain a high temperature of a predetermined temperature difference with respect to the second resistive temperature detector R12. In FIG. 5, it is limited to the upper limit Imax. That is, a current exceeding the upper limit Imax does not flow through the first resistive temperature detector R11. Thereafter, the constant current value Imax is maintained for a while, during which the first resistive temperature detector R11 is in the liquid phase, but at time t1, the value of the current I11 starts to decrease. This is because the liquid vaporizes and the liquid level drops, and the first resistive temperature detector R11 comes to be positioned in the gas phase. When the first resistive temperature detector R11 comes to be positioned in the gas phase, a small current value of the current I11 of the first resistive temperature detector R11 becomes sufficient in order to maintain the first resistive temperature detector R11 at a high temperature of a predetermined temperature difference with respect to the second resistive temperature detector R12. In FIG. 5, it is limited to the lower limit Imin. That is, a current smaller than the lower limit Imin does not flow through the first resistive temperature detector R11.

The current value transiently changes while the first resistive temperature detector R11 transitions from a stable state (for example, a state in which a relatively large current is applied in the liquid phase) to another stable state (for example, a state in which a relatively small current is applied in the gas phase). A change in the current value of the first resistive temperature detector R11 due to a change in the ambient environment of the first resistive temperature detector R11 (a change from a liquid phase to a gas phase or vice versa) is referred to as a transient current value change.

Conventionally, a predetermined threshold value is set, and if the current value (instantaneous value) of the resistive temperature detector is larger than the threshold value Ith, it is determined that the resistive temperature detector is in the liquid phase. If the current value (instantaneous value) of the resistive temperature detector is smaller than the threshold value Ith, it is determined that the resistive temperature detector is in the gas phase, and it is determined that the liquid level is lower than that of the resistive temperature detector.

On the other hand, in the present embodiment, the current value I11 are stored for the predetermined period Δt, the width ΔI of the transient current value change of I11 within the period Δt is calculated, and the width is compared with the predetermined threshold value ΔA. Specifically, if the change in the transient current value decreases and the width ΔI (ΔI<0) satisfies ΔI≤−ΔA, it is determined that the ambient environment of the first resistive temperature detector R11 has changed from the liquid phase to the gas phase.

In FIG. 5, the current I11 starts to decrease from time t1, but the change width is small and ΔI>−ΔA until time t2, and then becomes ΔI≤−ΔΔA at time t2, and it is determined that the first resistive temperature detector R11 is in the gas phase. In response to the determination that the first resistive temperature detector R11 is in the gas phase, the liquid may be supplied from the liquid supply device into the vaporizer.

When liquid is supplied into the vaporizer, the liquid level rises, and the first resistive temperature detector R11 is positioned in the liquid phase again. This is shown in FIG. 5 as an increase in the current value I11 after a time t3. Although the current value I11 starts to increase from the time t3, the change width is small and ΔI<+ΔA until a time t4, and then becomes ΔI≥+ΔΔA at the time t4, and it is determined that the ambient environment of the first resistive temperature detector R11 has changed from the gas phase to the liquid phase. In response to the determination that the first resistive temperature detector R11 is in the liquid phase, the supply of the liquid can be stopped.

Therefore, if the predetermined threshold value ΔA is appropriately set, the width ΔI of the change in the transient current value and the predetermined threshold value ΔA are compared with including their signs, whereby the present ambient environment (in a liquid phase or in a gas phase) of the first resistive temperature detector R11 can be specified.

The amount of current to be supplied to the resistive temperature detector in order to maintain a predetermined temperature difference varies depending on the resistive temperature detector even in the same ambient environment.

Therefore, in a similar manner as the problem as described above, the method of comparing the instantaneous value of the current value with the threshold value is affected by the variation in the characteristics of the resistive temperature detector (for example, when the one outputting a higher value is used or when the one outputting a lower value is used). In the present invention, since the instantaneous value of the current value is not used but the change width of the measured data (current value) of one resistive temperature detector (first resistive temperature detector R11 in the above description) during a predetermined period is used, the liquid phase/gas phase can be accurately determined without being affected by the variation in the characteristics of the resistive temperature detector.

The reason why the current I11 of the first resistive temperature detector R11 is not set to a value larger than the upper limit value Imax is to prevent a large current from flowing through the first resistive temperature detector R11 and to prevent erroneous detection due to the variation width exceeding the reference value even though the first resistive temperature detector R11 is in the liquid phase. The reason why the current I11 of the first resistive temperature detector R11 is not set to a value smaller than the lower limit value Imin is to prevent erroneous detection due to the variation width exceeding the reference value even though the first resistive temperature detector R11 is in the gas phase. Therefore, it is preferable to set the upper limit value Imax and the lower limit value Imin, but this is not essential for the liquid level detection.

Figure 6:
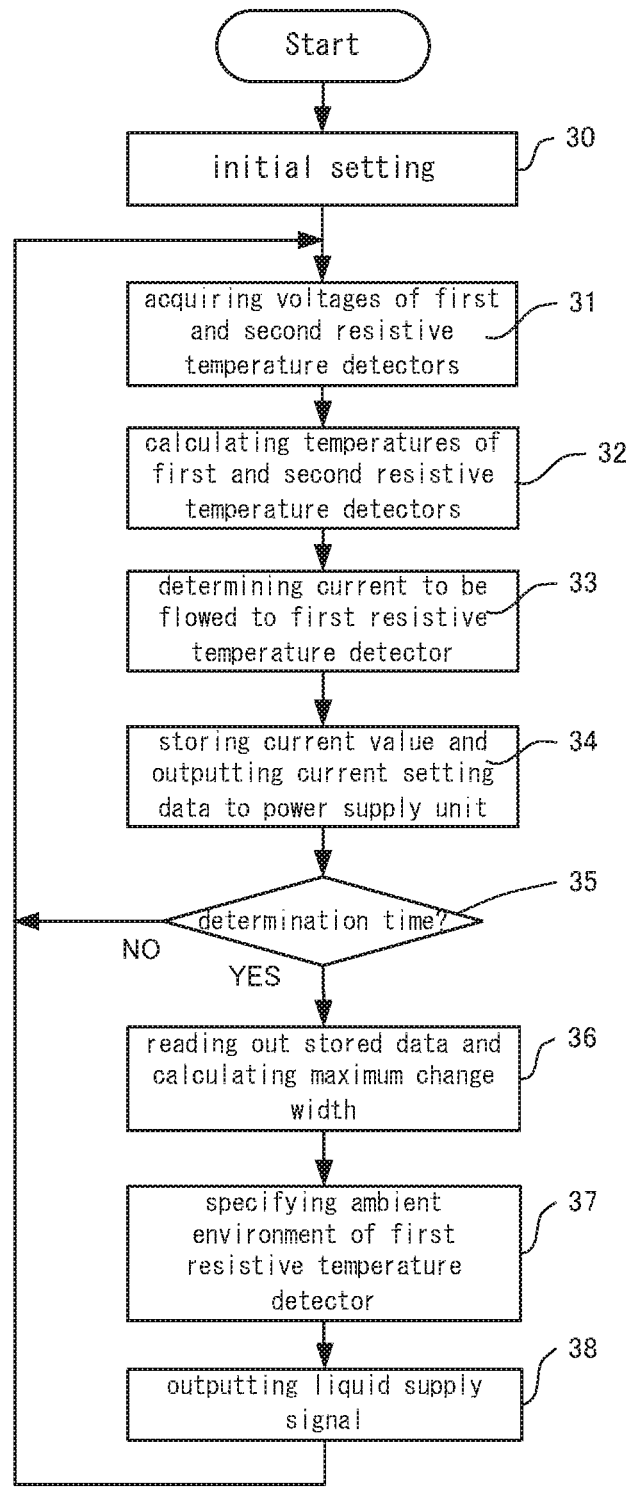
FIG. 6 is a flowchart showing the operation of the liquid level meter of FIG. 2.

FIG. 6 shows a flowchart of processing performed by the control unit 21. Hereinafter, the operation of the entire liquid level meter 20 will be described in more detail with reference to FIG. 6. Here, it is assumed that the first resistive temperature detector R11 and the second resistive temperature detector R12 are disposed as shown in FIG. 3, and the initial liquid level S0 is between the first resistive temperature detector R11 and the second resistive temperature detector R12.

In a step 30, the control unit 21 reads out control parameters (initial values, etc.) from the storage unit 24, and outputs data for specifying the initial current values of the first resistive temperature detector R11 and the second resistive temperature detector R12 among the control parameters to the power supply unit 22 as current setting data.

In addition, the control unit 21 secures a variable region in the storage unit 24. As the variable, there is a variable representing the ambient environment of the first resistive temperature detector R11. Here, it is assumed that "0" is set in the case of the liquid phase and "1" is set in the case of the gas phase.

The control parameters include, for example, the following.
An initial value of a variable representing the ambient environment of the first resistive temperature detector R11: here, it is set to "0".
A reference value $\Delta T$ of the temperature difference: $\Delta T$ is a positive value, for example, 10° C.
A reference value $\Delta A$ of the current change width: $\Delta A$ is a positive value, for example, 6 mA.
Initial values of the currents I11 and I12 of the first and second resistive temperature detectors R11 and R12: for example, I11=25 (mA), I12=2 (mA)
An upper limit value Imax and the lower limit value Imin of the current I11: for example, Imax=30 (mA), Imin=16 (mA).
Resistance values R11(0) and R12(0) of the first resistive temperature detector R11 and the second resistive temperature detector R12 at 0° C.: Both are 100Ω, if Pt100.

The power supply unit 22, to which the data of the initial current values of the first resistive temperature detector R11 and the second resistive temperature detector R12 have been input, flows the corresponding currents (analog) I11 and I12 through the first resistive temperature detector R11 and the second resistive temperature detector R12 by an internal D/A converter. Here, the current I12 is a micro constant current (e.g., 2 mA) as described above, and its value is maintained.

In a step 31, the control unit 21 acquires digital data into which the voltages V11 and V12 (analog) at both ends of the first resistive temperature detector R11 and the second resistive temperature detector R12, respectively, are A/D-converted from the voltage measuring unit 23. The voltage measuring unit 23 measures the voltages V11 and V12 (analog) at both ends of the first resistive temperature detector R11 and the second resistive temperature detector R12, respectively, as described above, at predetermined timings (e.g., 50 millisecond intervals), converts the measured voltages into digital data by the A/D converter, and outputs the digital data to the control unit 21.

In a step 32, the control unit 21 calculates temperatures T1 and T2 of the first resistive temperature detector R11 and the second resistive temperature detector R12, respectively, from the voltages V11 and V12 acquired in the step 31 by using Equation 1 or Equation 2 described above.

In a step 33, the control unit 21 determines a current value to be flowed to the first resistive temperature detector R11 from the temperatures T1 and T2 obtained in the step 32. Specifically, the control unit 21 determines the current value to be flowed to the first resistive temperature detector R11 in order to perform feedback control so that it becomes $T1-T2=\Delta T$. For example, if $T1-T2<\Delta T$, the control unit 21 determines a value larger than the present current value I11 and equal to or less than the upper limit value Imax as the current value of the first resistive temperature detector R11 to be flowed next. If $T1-T2>\Delta T$, the control unit 21 determines a value smaller than the present current value I11 and equal to or larger than the lower limit value Imin as the current value of the first resistive temperature detector R11 to be flowed next. If $T1-T2=\Delta T$, the control unit 21 determines the same value as the present current value I11 as the current value of the first resistive temperature detector R11 to be flowed next.

In a step 34, the control unit 21 stores the current value determined in the step 33 in the storage unit 24, and outputs current setting data corresponding to the current value to the power supply unit 22. As a result, as described above, the power supply unit 22 applies a current corresponding to the input current setting data to the first resistive temperature detector R11. At this time, the initial value of the current of the second resistive temperature detector R12 is maintained. As will be described later, by repeating the step 34, during the predetermined period $\Delta t$ current values I11 are stored.

In a step 35, the control unit 21 determines whether or not a time for determining the liquid level position (determination time) has come. Specifically, it is determined whether or not a predetermined time has elapsed from the measurement start time or from the time when the liquid level position was determined last time. The predetermined time is, for example, 500 milliseconds. When it is determined that the predetermined time has elapsed (having reached the determination time), the control proceeds to a step 36. If it is determined that the predetermined time has not elapsed (not having reached the determination time), the control returns to the step 31, and the above-described steps 31 to 34 are repeated, and the current values of the first resistive temperature detector R11 at 50 millisecond intervals are stored in the storage unit 24. Here, it is assumed that a capacity capable of storing measured values (current values) for a predetermined period is used among the capacities of the storage unit 24, and when the measured data exceeds the capacity, new measured data overwrites the oldest data and is stored. For example, the period of time for storing the measurement data is 30 seconds. All of the stored measurement data are used to calculate the change in the current value in a step 36, which will be described later. That is, $\Delta t=30$ (sec).

The elapse of the predetermined time can be obtained by acquiring a present time from the timer 25 in advance and storing it as a reference time, and then comparing the time acquired from the timer 25 with the reference time. It is possible to repeatedly determine the elapse of the predetermined time by updating the stored reference time with the time when it is determined that the predetermined time has elapsed.

In the step 36, the control unit 21 reads out the current value stored in the storage unit 24, and calculates the maximum change width $\Delta I$ of the change in the current value including signs. The sign is determined from the magnitude relation of the two current values which produce the maximum change width, and the anteroposterior relationship of the measured time thereof. Of the two current values having the maximum change width, if the value measured at a later time is large, the sign is "positive", and if the value measured at a later time is small, the sign is "negative".

In a step 37, the control unit 21 determines whether the first resistive temperature detector R11 is in the liquid phase or the gas phase using the maximum change width $\Delta I$ of the current value determined in the step 36. Specifically, when $\Delta I>0$ and $\Delta I \geq +\Delta A$, the control unit 21 determines that the ambient environment of the first resistive temperature detector R11 has changed from the gas phase to the liquid phase. When $\Delta I<0$ and $\Delta I \leq -\Delta A$, the control unit 21 determines that the ambient environment of the first resistive temperature detector R11 has changed from the liquid phase to the gas phase. If the ambient environment after the change is in the liquid phase, the variable representing the ambient environment is set to "0", and if the ambient environment after the change is in the gas phase, the variable representing the ambient environment is set to "1". When $\Delta I$ does not satisfy either of the above conditions, the control unit 21 does nothing and maintains the value stored in the variable representing the ambient environment.

In a step 38, the control unit 21 reads the variable representing the ambient environment, and outputs a liquid supply signal SG corresponding to the read variable. Specifically, if the variable representing the ambient environment is "1", since the first resistive temperature detector R11 is in the gas phase, the control unit 21 outputs the liquid supply signal SG of a level (for example, a high level) that causes the liquid supply device to supply the liquid L to the container 1. If the variable representing the ambient environment is "0", since the first resistive temperature detector R11 is in the liquid phase, the control unit 21 outputs the liquid supply signal SG of a level (for example, a low level) to the liquid supply device for stopping the supply of the liquid L to the container 1.

After the step 38, control returns to the step 31. The series of processing in the steps 31 to 38 ends when the power supply of the liquid level meter 20 is turned off.

As described above, according to the steps 30 to 38, the liquid level meter 20 may detect the liquid level position with reference to the position of the first resistive temperature detector R11 every 500 milliseconds by using the data measured for the previous 30 seconds and at 50 millisecond intervals. Therefore, it is possible that the liquid level meter 20 repeatedly monitors the position of the liquid level every 500 milliseconds, supplies the liquid from the external liquid supply device into the container 1 if the liquid level S drops below the position where the first resistive temperature detector R11 is disposed, and stops the liquid supply from the external liquid supply device into the container 1 if the liquid level S exceeds the position where the first resistive temperature detector R11 is disposed. As a result, the liquid level of the liquid L in the container 1 may be maintained within an appropriate range.

In the above description, the case where two resistive temperature detectors are used has been described, but the present invention is not limited thereto. Three or more resistive temperature detectors may be used, depending on the application. For example, if four resistive temperature detectors are used, one of which is placed in the gas phase to measure the reference temperature, and the other three of which are placed at different heights respectively, the lower limit, the upper limit, and the overflow of the liquid level can be detected. Experimental results of such an example of use are shown in FIG. 7.

In the experiment, one resistive temperature detector disposed in the gas phase for measuring the reference temperature and three resistive temperature detectors disposed at different heights at a position lower than the position of the one resistive temperature detector were disposed in the container. Among the three resistive temperature detectors, the resistive temperature detector disposed at the highest position is for detecting the overflow of the liquid level. The resistive temperature detector disposed at the lowest position is for detecting that the liquid level has reached the lower limit position. The resistive temperature detector disposed in the middle thereof is for detecting that the liquid level has reached the upper limit position.

When the container is empty and the temperature inside the container is set at about 200° C., the supply of the liquid was started, and after the liquid was supplied until the liquid level was positioned above the resistive temperature detector for overflow detection, the supply of the liquid was stopped, and the vaporized gas of the liquid was discharged to outside. In the meantime, the respective current values of the three resistive temperature detectors were controlled between the upper limit value and the lower limit value in the same manner as in FIG. 6.

Figure 7:
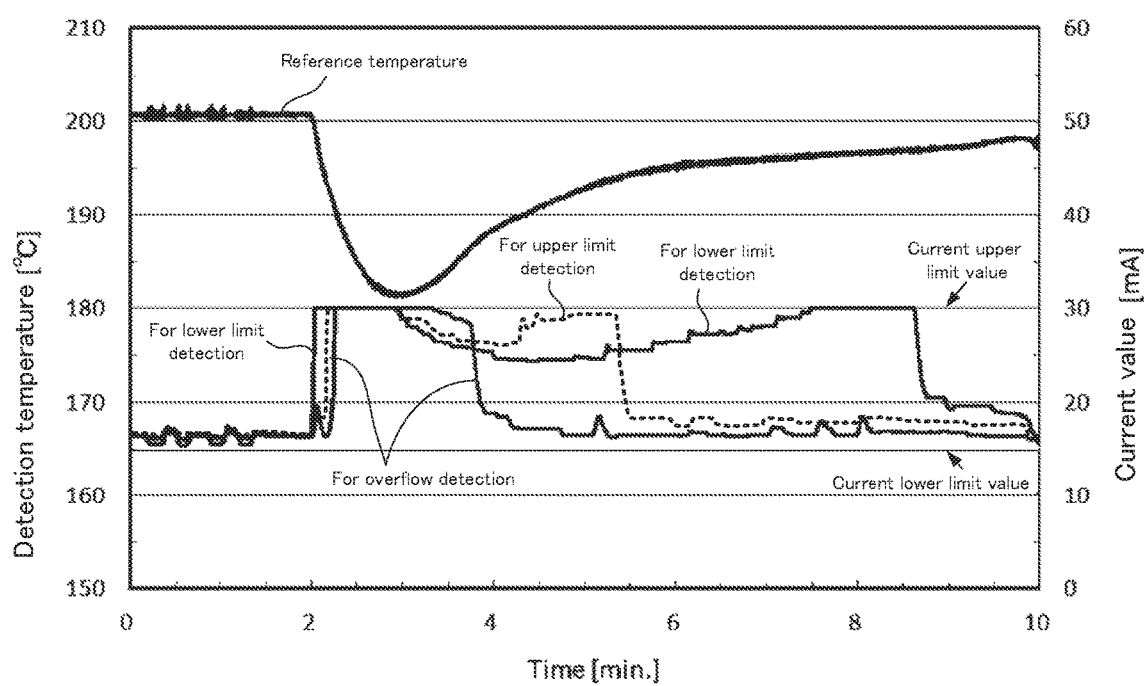
FIG. 7 is a graph showing experimental results.
Figure 8:
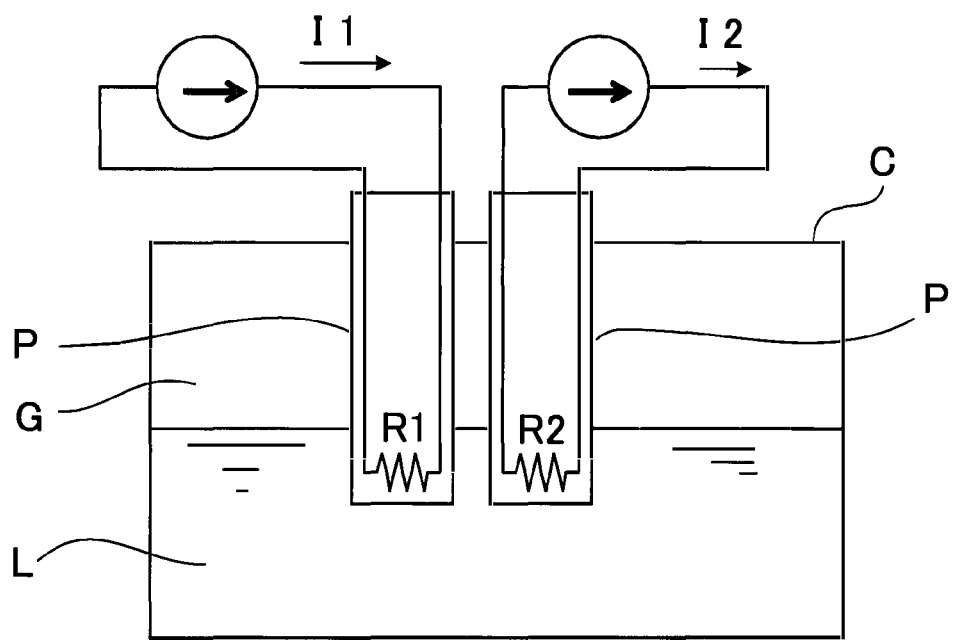
FIG. 8 is a schematic configuration diagram showing a conventional liquid level meter.

In FIG. 7, the graph denoted by "reference temperature" is the detected temperature of the resistive temperature detector for measuring the reference temperature (scale on the left). The graphs labeled "for lower limit detection," "for upper limit detection," and "for overflow detection" are the current values of the corresponding resistive temperature detectors (scale on the right).

When liquid is fed, the liquid level rises and is sequentially positioned higher than the positions at which the three resistive temperature detectors are respectively disposed, and the current values of the three resistive temperature detectors increase sequentially (approximately 2 minutes later) to maintain a predetermined temperature difference relative to the reference temperature. Therefore, each maximum change width $\Delta I$ ($\Delta I>0$) of the respective current values of the three resistive temperature detectors becomes larger than the reference value $\Delta A$ of the current change amount $\Delta I \geq +\Delta A$, and the change from the gas phase into the liquid phase is detected, and it is determined that the liquid level is positioned above the position where the resistive temperature detector for overflow detection is disposed. At this time, the reference temperature is lowered because a relatively low-temperature liquid is supplied.

Thereafter, over time, the liquid level drops due to evaporation, and about 4 minutes have elapsed, the current value of the resistive temperature detector for overflow detection rapidly drops, and the maximum change width $\Delta I$ ($\Delta I<0$) thereof becomes $\Delta I \leq -\Delta A$, and it is detected that the resistive temperature detector for overflow detection exits from the liquid phase into the gas phase (the liquid level position becomes lower than the position where the resistive temperature detector for overflow detection is disposed). During this period, although the current values of the resistive temperature detector for upper limit detection and the resistive temperature detector for lower limit detection also fluctuate, each absolute value of the fluctuation widths is smaller than $\Delta A$, and it can be determined that the ambient environment of them has not changed (both of them are in the liquid phase).

With the elapse of time, the liquid level further drops due to evaporation, and about 5 minutes and a half has elapsed, the current value of the resistive temperature detector for upper limit detection rapidly drops, the maximum change width $\Delta I$ ($\Delta I<0$) thereof becomes $\Delta I \leq -\Delta A$, and it is detected that the resistive temperature detector for upper limit detection exits from the liquid phase into the gas phase (the liquid level position becomes lower than the position where the resistive temperature detector for upper limit detection is disposed). During this period, the current values of the resistive temperature detector for lower limit detection and the resistive temperature detector for overflow detection also fluctuate, but each absolute value of the fluctuation widths is smaller than $\Delta A$, and it can be determined that the ambient environment of them has not changed (the resistive temperature detector for overflow detection is in the gas phase and the resistive temperature detector for lower limit detection is in the liquid phase).

Thereafter, over time, the liquid level further drops due to evaporation, and around 8 minutes and a half elapse, the current value of the resistive temperature detector for lower limit detection rapidly drops, and the maximum change width $\Delta I$ ($\Delta I<0$) thereof becomes $\Delta I \leq -\Delta A$, and it is detected that the resistive temperature detector for lower limit detection exits from the liquid phase into the gas phase (the liquid level position becomes lower than the position where the resistive temperature detector for lower limit detection is disposed). During this period, although the current values of the resistive temperature detector for upper limit detection and the resistive temperature detector for overflow detection also fluctuate, each absolute value of the fluctuation widths is smaller than $\Delta A$, and it can be determined that the ambient environment of them has not changed (both of them are in the gas phase).

Thus, by arranging three or more resistive temperature detectors at different heights, it is possible to detect a change in the liquid level due to vaporization and supply of the liquid more finely, and it is possible to control the liquid level position more accurately.

The numerical values listed above are just examples, and are not intended to be limiting. The control parameters ($\Delta A$, $\Delta T$, Imax, and Imin) used in the determination may be appropriately determined by considering the type of the liquid to be used, the gas phase temperature and the liquid phase temperature in the vaporizer, and the like. The sampling time, the determination time, $\Delta t$, and the data storage capacity therebetween may be determined in the same manner.

The configuration shown in FIG. 2 is an example, and any configuration may be employed as long as the ambient environment (liquid phase or gas phase) of the resistive temperature detector can be determined in accordance with the above operation principle (determination based on the transient current value change width of the resistive temperature detector) and the liquid level position can be detected.

Although the control unit 21 executes the programs read from the storage unit 24, the control unit 21 may be implemented by a dedicated IC such as an ASIC or a FPGA. In this case, the control unit 21 may be implemented by one IC or a plurality of ICs. For example, each of the functional blocks shown in FIG. 4 may be implemented by an IC.

In the above description, a case has been described in which the liquid level is detected and the supply of the liquid is controlled on the assumption that each resistive temperature detector is in the liquid phase at the start of the control (the initial value of the variable representing the ambient environment is "0"). Liquid phase of the initial ambient environment is preferred to prevent oversupply of liquid, but is not limited thereto. It may be assumed that each resistive temperature detector is positioned in the gas phase at the start of the control (the initial value of the variable representing the ambient environment is "1").

The flowchart of FIG. 6 described above is an example, and various modifications may be made. For example, in an environment in which multi-tasking is possible, the processing of measuring and storing data (steps 31 to 34) and the processing of determining a liquid phase/a gas phase (steps 36 to 38) may be implemented as separate programs. A plurality of programs can be executed in parallel while mutually adjusting their timings by interrupt processing or the like.

In the above description, the case where the present time is acquired from the timer 25 and the elapsed time is determined has been described, but the present invention is not limited thereto. The control unit 21 may determine the elapsed time by counting the number of clocks CLK supplied from the clock generator 26.

An arbitrary method can be employed as a method of feedback-controlling the current value of the resistive temperature detector so as to obtain a constant temperature difference $\Delta T$.

The temperature difference $\Delta T$ may be a value having a predetermined width. That is, whether or not $T1-T2$ is equal to $\Delta T$ may be determined within a predetermined error. For example, when $\delta$ is a minute value, $T1-T2=\Delta T$ may mean $\Delta T - \delta < T1 - T2 < \Delta T + \delta$.

The second resistive temperature detector R12 for measuring the reference temperature is not limited to a resistive temperature detector, and may be anything capable of measuring temperature (temperature measuring body). For example, it may be a known thermocouple. When measuring temperature using a thermocouple, cold junction compensation is required, and well known techniques (e.g., Kozo Nakamura, "High-precision resolution of several mV DC signals to 1/10,000", Transistor Gijutsu SPECIAL, CQ Publishing Co., Ltd., Jul. 1, 2015, No. 131, pp. 47-62) may be used. A/D converter IC (e.g., MAX6675 or MAX31855 manufactured by MAXIM Corporation) with built-in cold junction compensation circuit may also be used.

The reference temperature may be measured at any position within the vaporizer (container), and a sensor (for example, a rod-shaped protective pipe in which a resistive temperature detector is enclosed) may be horizontally fixed to measure the temperature at a position outside the center of the container. In addition, the temperature may be measured at a location in the middle of the sensor, at an upper portion of an inner surface or an inner side surface of the vaporizer, or at the like.

The vaporizer also includes a tank for liquid storage and the like. A tank of a liquid supply system (liquid supply device) may be used at normal temperature or at high temperature. The present invention is also applicable to these.

The embodiment disclosed this time is an example, and the present invention is not limited to the embodiment described above. The scope of the present invention is specified by the claims in consideration of the description of the detailed description of the invention, and includes all modifications within the scope of equivalents of the terms set forth in the claims.

INDUSTRIAL APPLICABILITY

According to the present invention, in a liquid level meter including a resistive temperature detector and a temperature measuring body disposed at a higher position than the resistive temperature detector, when a current value flowing through the resistive temperature detector changes to a predetermined value or more within a predetermined time, it is determined that a position of a liquid level changes beyond the position at which the resistive temperature detector is disposed, whereby the liquid level position can be accurately detected without being affected by variations of the resistive temperature detector used.

EXPLANATION OF REFERENCE NUMERALS

1 Container
2 Support portion
3 Liquid supply pipe
4 First protective pipe
5 Second protective pipe
L Liquid phase (liquid)
G Vapor phase (gas)
S Liquid level
20 Liquid level meter
21 Control unit
22 Power supply unit
23 Voltage measurement unit
24 Storage unit
25 Timer
26 Clock generating unit
27 Temperature detecting unit
28 Current control unit
29 Liquid level detecting unit
R11 First resistive temperature detector (for liquid level detection)
R12 Second resistive temperature detector (reference temperature)

The invention claimed is:

1. A liquid level meter comprising:
a first resistive temperature detector;
a temperature measuring body disposed at a position higher than a position of the first resistive temperature detector disposed; and
a control unit detecting a position of a liquid level using the temperature measuring body and the first resistive temperature detector; wherein when a current value flowing through the first resistive temperature detector has changed by a predetermined constant value or more within a predetermined period of time, the control unit detects that the position of the liquid level has changed from a position higher than the position of the first resistive temperature detector disposed to a position lower than the position of the first resistive temperature detector disposed, or detects that the position of the liquid level has changed from a position lower than the position of the first resistive temperature detector disposed to a position higher than the position of the first resistive temperature detector disposed, and further wherein the control unit includes a temperature detection unit, a liquid level detection unit, and a current control unit, the temperature detecting unit detects temperatures of the temperature measuring body and the first resistive temperature detector, the current control unit determines a current value to be flowed through the first resistive temperature detector such that a temperature difference between the temperature of the first resistive temperature detector detected by the temperature detecting unit and the temperature of the temperature measuring body detected by the temperature detecting unit becomes a predetermined first value, and the liquid level detecting unit detects the position of the liquid level from a change in the current value flowing through the first resistive temperature detector, and further comprising a voltage measuring unit measuring a voltage of both ends of the first resistive temperature detector, wherein the temperature detecting unit determines the temperature of the first resistive temperature detector from the voltage of both ends of the first resistive temperature detector measured by the voltage measuring unit, and the current controlling unit determines the current value to be flowed to the first resistive temperature detector as a value smaller than the current value flowing through the first resistive temperature detector when the temperature difference is larger than a predetermined reference value, determines the current value to be flowed to the first resistive temperature detector as a value larger than the current value flowing through the first resistive temperature detector when the temperature difference is smaller than the reference value, and determines the current value to be flowed to the first resistive temperature detector as a same value as the current value flowing through the first resistive temperature detector when the temperature difference is equal to the reference value.

2. The liquid level meter according to claim 1, further comprising a power supply unit applying a current having the current value determined by the current control unit to the first resistive temperature detector.

3. The liquid level meter according to claim 1, wherein the liquid level detecting unit detects that the liquid level has changed from a position higher than the position of the first resistive temperature detector disposed to a position lower than the position of the first resistive temperature detector disposed if the change width of the current value flowing through the first resistive temperature detector within the predetermined period of time is a negative value and an absolute value of the change width is equal to or greater than a positive predetermined second value, and detects that the liquid level has changed from a position lower than the position of the first resistive temperature detector disposed to a position higher than the position of the first resistive temperature detector disposed, if the change width is a positive value and the absolute value of the change width is equal to or greater than the second value.

4. The liquid level meter according to claim 1, wherein the first resistive temperature detector and the temperature measuring body are fixed in a horizontal direction by a support member.

5. The liquid level meter according to claim 1, wherein the temperature measuring body is a resistive temperature detector through which a current having a value smaller than the value of the current flowing through the first resistive temperature detector flows.

6. The liquid level meter according to claim 1, wherein
when the current value applied to the first resistive temperature detector so that the temperature difference becomes the first value is larger than a predetermined upper limit value, the current control unit maintains the current value applied to the first resistive temperature detector at the upper limit value, and
when the current value applied to the first resistive temperature detector so that the temperature difference becomes the first value is smaller than a predetermined lower limit value, the current control unit maintains the current value applied to the first resistive temperature detector at the lower limit value.

7. The liquid level meter according to claim 1, wherein the liquid level detecting unit outputs a signal to raise the liquid level when it is determined that the liquid level is at a position lower than the position where the first resistive temperature detector is disposed, and the liquid level detecting unit outputs a signal to stop the rise of the liquid level when it is determined that the liquid level is at a position higher than the position where the first resistive temperature detector is disposed.

8. A vaporizer, comprising:
a container provided with the liquid level meter according to claim 1, wherein
a liquid level of a liquid contained in the container is detected by the liquid level meter, and
the liquid to be vaporized is contained in the container.

9. A liquid level meter, comprising:
a first resistive temperature detector;
a temperature measuring body disposed at a position higher than a position of the first resistive temperature detector disposed; and
a control unit detecting a position of a liquid level using the temperature measuring body and the first resistive temperature detector; wherein
when a current value flowing through the first resistive temperature detector has changed by a predetermined constant value or more within a predetermined period of time, the control unit detects that the position of the liquid level has changed from a position higher than the position of the first resistive temperature detector disposed to a position lower than the position of the first resistive temperature detector disposed, or detects that the position of the liquid level has changed from a position lower than the position of the first resistive temperature detector disposed to a position higher than the position of the first resistive temperature detector disposed, and further wherein
the control unit includes a temperature detection unit, a liquid level detection unit, and a current control unit, the temperature detecting unit detects temperatures of the temperature measuring body and the first resistive temperature detector,
the current control unit determines a current value to be flowed through the first resistive temperature detector such that a temperature difference between the temperature of the first resistive temperature detector detected by the temperature detecting unit and the temperature of the temperature measuring body detected by the temperature detecting unit becomes a predetermined first value, and
the liquid level detecting unit detects the position of the liquid level from a change in the current value flowing through the first resistive temperature detector, and
further comprising a power supply unit applying a current having the current value determined by the current control unit to the first resistive temperature detector, and
further comprising a second resistive temperature detector to which a current of an arbitrary magnitude is applied, wherein
the second resistive temperature detector is disposed at a position lower than the position where the temperature measuring body is disposed and at a height different from the position where the first resistive temperature detector is disposed,
the temperature detecting unit detects a temperature of the second resistive temperature detector,
the current controlling unit determines a current value to be flowed to the second resistive temperature detector so that a temperature difference between the temperature of the second resistive temperature detector detected by the temperature detecting unit and the temperature of the temperature measuring body detected by the temperature detecting unit becomes the first value,
the power supply unit flows a current of the current value to be flowed to the second resistive temperature detector determined by the current controlling unit to the second resistive temperature detector,
the liquid level detecting unit detects that the liquid level is changed from a position higher than the position where the second resistive temperature detector is disposed to a position lower than the position where the second resistive temperature detector is disposed if a change width of the current value flowed through the second resistive temperature detector is a negative value and an absolute value of the change width is equal to or greater than a positive predetermined second value, and that the liquid level is changed from a position lower than the position where the second resistive temperature detector is disposed to a position higher than the position where the second resistive temperature detector is disposed if the change width of the current value flowed through the second resistive temperature detector is a positive value and the absolute value of the change width is equal to or greater than the second value, and
the liquid level detecting unit detects the position of the liquid level from the detection result of the position of the liquid level using the first resistive temperature detector and the detection result of the position of the liquid level using the second resistive temperature detector.

10. The liquid level meter according to claim 9, wherein the second resistive temperature detector is disposed between the first resistive temperature detector and the temperature measuring body in the vertical direction, and the liquid level detecting unit outputs a signal to raise the liquid level when it is determined that the liquid level is at a position lower than the position where the first resistive temperature detector is disposed, and the liquid level detecting unit outputs a signal to stop the rise of the liquid level when it is determined that the liquid level is at a position higher than the position where the second resistive temperature detector is disposed.

11. The liquid level meter according to claim 9, wherein the first resistive temperature detector, the second resistive temperature detector, and the temperature measuring body are platinum resistive temperature detectors.

12. A liquid level detecting method using a resistive temperature detector and a temperature measuring body disposed at a position higher than a position where the resistive temperature detector is disposed, comprising:

a step of detecting temperatures of the resistive temperature detector and the temperature measuring body with current flowing to the resistive temperature detector;

a step of adjusting a current value flowing through the resistive temperature detector so that a temperature difference between a detected temperature of the resistive temperature detector and a detected temperature of the temperature measuring body becomes a predetermined first value; and a detecting step of detecting a position of the liquid level from a change width of the current value flowing through the resistive temperature detector within a predetermined period of time; wherein the detecting step includes a step of detecting that the liquid level has changed from a position higher than a position of the resistive temperature detector disposed to a position lower than the position of the resistive temperature detector disposed if the change width is a negative value and an absolute value of the change width is equal to or more than a positive second value; and a step of detecting that the liquid level has changed from a position lower than the position of the resistive temperature detector disposed to a position higher than the position of the resistive temperature detector disposed if the change width is a positive value and the absolute value of the change width is equal to or greater than the second value; and further comprising with a voltage measuring unit, measuring a voltage of both ends of the resistive temperature detector, with a temperature detecting unit, determining the temperature of the resistive temperature detector from the voltage of both ends of the resistive temperature detector measured by the voltage measuring unit, and with a current controlling unit, determining the current value to be flowed to the resistive temperature detector as a value smaller than the current value flowing through the resistive temperature detector when the temperature difference is larger than a predetermined reference value, determining the current value to be flowed to the resistive temperature detector as a value larger than the current value flowing through the resistive temperature detector when the temperature difference is smaller than the reference value, and determining the current value to be flowed to the resistive temperature detector as a same value as the current value flowing through the resistive temperature detector when the temperature difference is equal to the reference value.

\* \* \* \* \*